United States Patent [19]
Hachikawa et al.

[11] Patent Number: 5,692,423
[45] Date of Patent: Dec. 2, 1997

[54] VIBRATION FINISHING METHOD AND APPARATUS FOR SAME

[75] Inventors: Syuichi Hachikawa, Toyama; Yasumasa Kataoka, Nagahama, both of Japan

[73] Assignees: Kabushiki Kaisha Fujikoshi, Toyama; Tokyo Hi-Tech Co., Ltd., Ayase, both of Japan

[21] Appl. No.: 437,681

[22] Filed: May 9, 1995

[51] Int. Cl.⁶ .................... B26D 7/14; B26F 1/02
[52] U.S. Cl. .................... 83/19; 83/39; 83/137
[58] Field of Search ................ 83/39, 49, 137, 83/19

[56] References Cited

U.S. PATENT DOCUMENTS

| Re. 34,602 | 5/1994 | Naito et al. | 83/49 |
|---|---|---|---|
| 3,107,567 | 10/1963 | Lindner | 83/137 |
| 3,211,034 | 10/1965 | Andris | 83/137 |
| 3,700,150 | 10/1972 | Cheney | 83/13 |
| 3,765,285 | 10/1973 | Achler et al. | 83/658 |
| 4,524,660 | 6/1985 | Yonezawa | 83/137 |
| 4,653,365 | 3/1987 | Takasaki et al. | 83/49 |
| 5,042,336 | 8/1991 | Capps | 83/13 |
| 5,253,559 | 10/1993 | Philippe et al. | 83/137 |
| 5,320,013 | 6/1994 | Nonami et al | 83/13 |
| 5,413,018 | 5/1995 | Wada et al. | 83/456 |
| 5,448,933 | 9/1995 | Grabbee | 83/24 |

FOREIGN PATENT DOCUMENTS

57-102310  6/1982  Japan.
62-241700  10/1987  Japan.

Primary Examiner—Kenneth E. Peterson
Assistant Examiner—Sean A. Pryor
Attorney, Agent, or Firm—Spencer & Frank

[57] ABSTRACT

A vibration finishing method and apparatus in which the surface roughness and form of a hole in a compound material such as a printed board can be made excellent and the working accuracy of the hole can be significantly improved and the working cost of the hole can be lowered. In the punch pressing device, a compound material is fixed to a lower metal mold having a lower die hole into which a punching tool can be inserted. While the compound material is held between the lower metal mold and a pressing plate and pressed by pressing members provided with the pressing plate having an upper die hole into which the punching tool can be inserted, a minute-vibration of frequency of several ten hertz is applied onto the punching tool and then, the compound material is punched out. After that, the punching tool is temporarily drawn from the hole to be worked in the compound material. The punching tool is re-inserted into the worked hole in the compound material while a non-vibration or the minute vibration of frequency of several ten hertz is applied again onto the punching tool.

5 Claims, 7 Drawing Sheets

| NUMBER | PUNCHING METHOD | PRESENCE OF PRESSING PLATE | RISE | SWELL IN INNER SURFACE OF HOLE | SURFACE ROUGHNESS OF INNER SURFACE OF HOLE | FORM OF HOLE |
|---|---|---|---|---|---|---|
| A | PRIOR ART SINGLE SIDED PUNCH PRESSING WORK | NO | YES | YES | BAD ≥140 μm |  32, 31, 33 |
| B | | YES | NO (GOOD) | YES | BAD 140 μm |  31, 33 |
| C | PRIOR ART TWICE PUNCHING WORK | NO | YES | YES | BAD 140 μm | — |
| D | | YES | NO (GOOD) | PRETTY GOOD | PRETTY GOOD 60~80 μm |  33, 31 |
| E | VIBRATION PUNCHING WORK | NO | YES | NO (GOOD) | PRETTY GOOD 60~80 μm | — |
| F | VIBRATION PUNCHING WORK (THE INVENTION) | YES | NO (GOOD) | NO (EXCELLENT) | GOOD 30 μm |  33 |

FIG. 7

PRIOR ART

FIG. 8

PRIOR ART

FIG. 9

PRIOR ART

FIG. 10
PRIOR ART

VIBRATION FINISHING METHOD AND APPARATUS FOR SAME

FIELD OF THE INVENTION

The present invention relates to a punching and hole-working method by means of a press for a printed board or the like composed of a compound material, and more particularly to a vibration finishing method and apparatus for forming holes in a printed board by means of a press. In this specification, words "a compound material" means a compound material consisting mainly of a thermoplastic resin as a matrix and mixed with a reinforced material or a filler such as a glassfiber, a carbonfiber or a resin, which thermoplastic resin including an ABCresin(acrylnitril-butadiene-styrene), rigid PVC(rigid polyvinyle chrorido), polycarbonate, or the like.

BACKGROUND OF THE INVENTION

Conventionally, as methods for boring holes such as through-holes in a printed board (referred to as "board", hereafter), a drilling method and a punching and hole-working method by means of a press, etc. have been employed. In the case of a method by which the board is directly subjected to cutting and punching work by means of a drill, the surface roughness Ra(avarage surface roughness from the centerline of a surface) of the inner face of the worked hole is generally Ra 10 μm to 30 μm, the hole itself having an excellent configuration. This technique has been most frequently utilized for through-hole processing and has considerably high reliability. However, through-holes have had to be directly worked one by one by means of a drill, and therefore, defects have occurred in that the efficiency of working the holes is considerably low and the cost thereof is unfavorably high.

On the other hand, in the case of what is called a single-sided punch press process in which a board is attached to a die on which die holes are bored and through-holes are formed in the board by means of a punching tool (referred to merely as "a punch" hereinafter which is provided in alignment with the die holes, through-holes can be processed in a short time and at lowered cost, giving this punch press method excellent productivity and enabling it to be utilized for various kinds of hole-forming processes. In addition, this technique has an advantage in that a complicated hole-forming process for a special shaped hole or the like can be simply made. However, various types of problems have been brought about in that cracks are formed between the holes, or the peripheral portions of the holes are whitened, depending on the material of the board, which disadvantageously destroys plasticity. Thus, in order to solve these problems, the printed board has had to be heated so that the cracks can be reduced, which reduces the productivity of the press machine. In this case, however, there has been another problem in that the dimensional accuracy of the holes deteriorates because of the expansion and contraction of the material.

Figure 7:
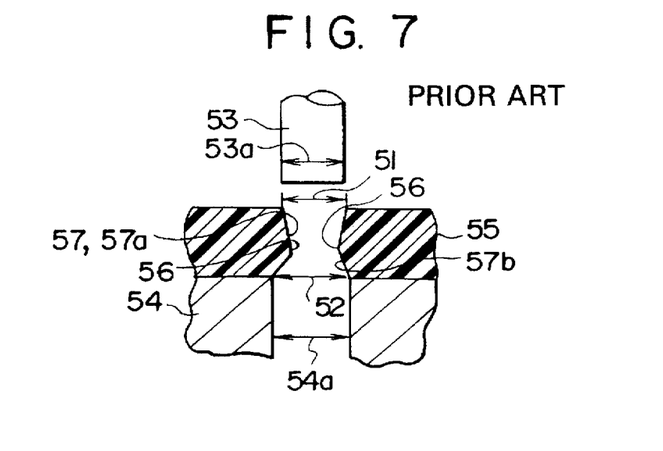
FIG. 7 is a longitudinal sectional view of a hole formed in accordance with a prior art working method.

The dimensional accuracy of the holes under ordinary temperatures in the press process by means of a punch will be described with reference to FIG. 7. As illustrated in FIG. 7, the dimensions of a hole in the upper and lower surfaces 51 and 52 of the board 55 are respectively formed to be substantially the same as the diameter 53a of a punch 53 and the diameter 54a of a die 54 respectively. However, the intermediate part of the hole swells because of the restorative action of the board 55. The dimensional change of the diameter of this swelling part 56 is not generally constant due to conditions such as the thickness of the board, etc, but is generally speaking as small as 0.05 mm to 0.2 mm in diameter 53a for the hole having a diameter of about from 0.8 mm to 1.5 mm Further, the surface roughness of the inner surface 57 of the punched hole is extremely bad at Ra 140 μm or more, since the length of a broken surface 57b thereof is larger than that of a sheared surface 57a of the upper part. Therefore, this conventional punch pressing technique has not been able to be employed for processing through-holes.

Figure 8:
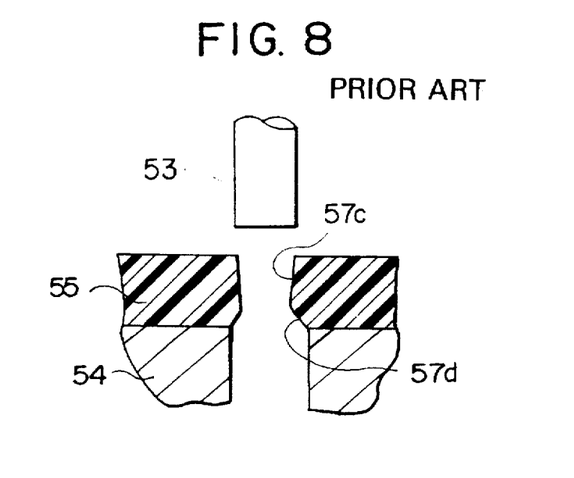
FIG. 8 is a longitudinally sectional view of a hole formed in accordance with another prior art working method.

Additionally, as shown in FIG. 8, in a case in which the speed of a press is lowered and the clearance of the diameter of a die 54 is made smaller than that of a punch 53, the length of a sheared surface 57c can be made longer than that of the above-described sheared surface 57a and the length of a broken surface 57d can be made shorter than the broken surface 57b. However, the surface roughness is limited to Ra 100 μm to 120 μm, which is only slightly improved over the case stated above. Other results have not differed from those in the case shown in FIG. 7.

Figure 9:
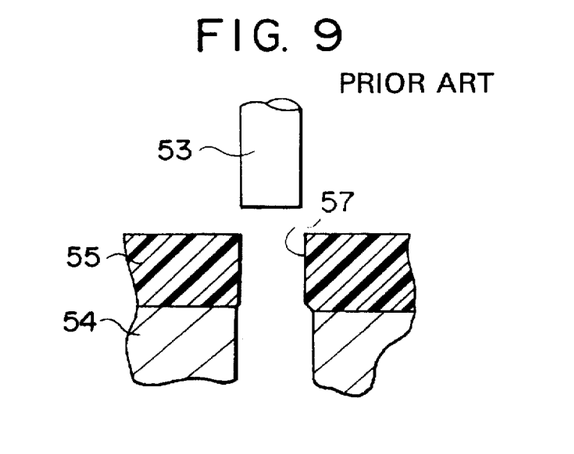
FIG. 9 is a longitudinally sectional view of a hole formed in accordance with still another prior art working method.

Thus, there has been proposed a punching method in which a punching process is carried out twice so that the roughness of the inner surface of the punched hole is improved. According to this punching method, in a first process the board is initially punched using a punch of 0.1 mm smaller dismeter than that of the finished dimension. Thereafter, the swelling parts of the board are designed to be cut by means of a punch of the finished dimension. In accordance with this method, as illustrated in FIG. 9, the broken surface is significantly decreased, and the surface roughness becomes Ra 60 μm to 80 μm, improving the accuracy of the hole. However, problems have occurred in that it is difficult to obtain the positional accuracy of holes between the first process and the second process and that the pressing process is divided into two steps. Therefore, these are serious problems in terms of mass production.

Figure 10:
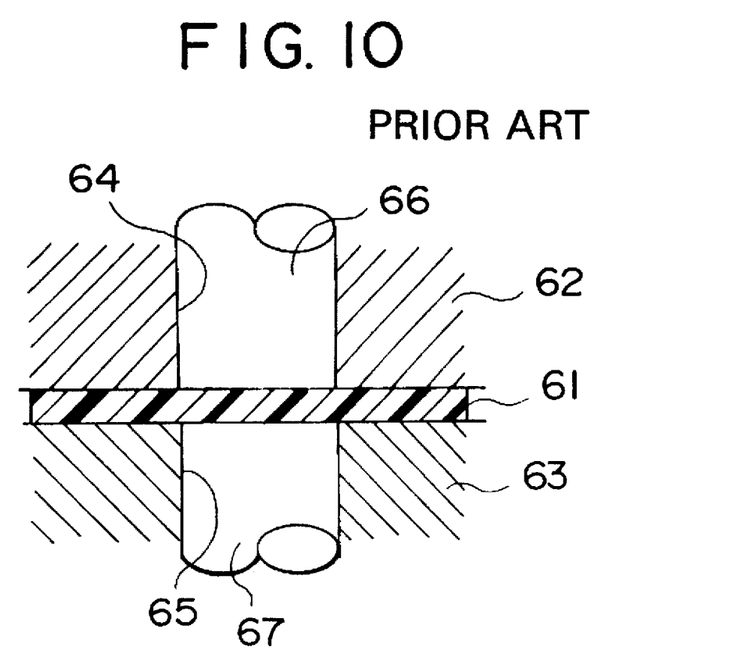
FIG. 10 is an illustration of metal molds employed in a further prior art vibration finishing and punching method.

Still another conventional punching technique is disclosed in Japanese Unexamined Patent Publication No. Sho. 57(1982)-102310. As can be seen in FIG. 10, a board 61 is sandwiched between upper and lower dies 62 and 63, and the upper and lower punches 66 and 67 are provided so as to be opposed in die holes 64 and 65 formed in the upper and lower dies 64 and 65. The board 61 is punched while the upper and lower punches 66 and 67 reciprocate upward and downward with the board 61 held by the upper and lower punches 66 and 67 and the dies 62 and 63. After the board 61 is punched, the upper and lower punches 66 and 67 are reciprocally moved upward and downward. This method is what is called a vibration finishing and punching method. However, in accordance with this vibration finishing and punching method, the side surfaces of punches, specifically, parts in the vicinity of the inside diameter of holes are melted and deformed and liable to be sheared because of the vibration energy generated on the board held by the punches, which vibrates the upper and lower punches, so that the hole may be entirely sheared. Further, in accordance with this vibration finishing and punching method, the side surface abuts against the inner surface of the hole, which is softened due to the vibration energy, and the side surface of the punch is transferred to the inner surface of the hole. Therefore, an extremely satisfactory inner surface of the hole can be obtained. Therefore, a hole which is extremely favorable for a through-hole can be achieved. However, in accordance with this method, problems have occurred in that the structure of the machine is very complicated, that is, an upper and lower pairs of punch and dice are required, and the structure of the metal mold becomes undesirably complicated and the cost is raised. In addition, there has been also arisen a problem that it is hard to remove punching residue.

In order to solve these problems, Japanese Unexamined Patent Publication No. Sho. 62(1987)-241700 discloses, as an example, a method in which one type of vibration is applied to a punch with a single-sided punch press structure, the board is punched in such a way that the punching tool is moved reciprocally by a minute distance a plurality of times to that a hole is punched, rather than punching the board once at a stroke. According to this method, such problems as cracks between holes on the board and peeling of the base material or the like rarely occur. It becomes difficult to occur the destruction of plasticity in the periphery of a hole. Material powder or dust of the board which is produced as a result of the finely pulverized board is applied and solidified into the inner surface of the hole by means of a punching tool. Then the inner surface of the hole is cut and finished by virtue of friction between the inner surface of the hole and the tool, so that a hole with a remarkably favorable inner surface can be formed. These advantages are very similar to effects obtained by the above vibration finishing and punching method. In contrast to the above vibration finishing and punching method, according to the method using the single-sided punch, even when the punch is reciprocally moved by a minute distance upward and downward a plurality of times or vibration is applied to the punch, heat energy is not substantially produced and only mechanical shearing is continuously carried out. The sheared inner surface of the hole is not smoothed. In other words, while the surface of the hole is melted under frictional heat generated due to frictional force, the surface of the punch is not transferred to the inner surface of the hole as in the case of the vibration finishing and punching method. Therefore, according to the single-sided punch method, surface roughness is further improved, but the dimensional accuracy is considerably lowered, and further, powder or dust is much generated from the bord during work, compared with the vibration finishing and punching method.

SUMMARY OF THE INVENTION

With the above stated problems fully considered, an object of the present invention is to overcome them and to provide a vibration finishing method and apparatus which forms holes having fine surface roughness without deformation in a composite material board such as printed circuit bord with significantly improved accuracy and reduced working cost.

The above mentioned object and other objects can be accomplished in accordance with the present invention by carrying out an improved vibration finishing method in a single sided punch pressing device which is capable of mounting a composite material such as a printed circuit board on a die having a die hole bored therein and provides a punching tool which is capable of penetrating the composite material and of being inserted into the die hole. In the method the composite material is fixed onto the die and a pressing member is provided for pressing the composite material. The punching process comprises the steps of punching out the composite material by means of the punching tool while the composite material being arbitrarily pressed with the pressing member and applying a minute vibration of several ten hertz to the punching tool; further, drawing the punching tool from a punched hole in the composite material while the composite material being arbitrarily pressed with the pressing member; and re-inserting the punching tool into the punched hole in the composite material by applying a non-vibration or applying again the minute vibration of several ten hertz to the punching tool while pressing arbitrarily the compound material with the pressing member.

According to another aspect of the present invention, in a vibration finishing method, drawing and re-inserting operations of the punching tool are repeated several times to improve the accuracy of a hole shape. Further, the non-vibration or the minute vibration of several ten hertz applied to the punching tool even after the punching operation finishes the inner surface of a hole by the mutual sliding of the punching tool and the inner wall of the hole, so that the surface roughness of the inner surface of the hole is improved and powder or dust from the board is reduced.

According to still another aspect of the present invention, in a single-sided punch pressing device, which is capable of mounting a composite material such as a printed circuit board on a die with a die hole bored therein, and provides a punching tool which is capable of penetrating the composite material and of inserting into the die hole while applying a minute vibration of several ten hertz to the punching tool, a vibration finishing apparatus is used in which the composite material is fixed onto the die, and a pressing member for pressing the composite material is provided. The pressing member includes a pressing plate abutting against the composite material and a metal mold attaching plate to which an upper metal mold is attached with the punching tool attached thereto, and holds a fluid cylinder between the pressing plate and the metal mold attaching plate so that the cylinder is capable of providing an adjustable pressure for the pressing plate. The pressing plate is provided a dice hole to which the punching tool is slidably fitted with a small gap provided therebetween.

Further, it will be understood that, in place of the fluid cylinder, the pressing member, an elastic member such as urethane or a spring capable of providing adjustable pressure for the pressing plate and an adjusting member capable of adjusting the resilient force of the elastic member may be provided between the pressing plate and the metal mold attaching plate Consequently, the pressing force relative to the board can be readily and simply controlled by a simpler structure.

In accordance with the present invention having the above-stated construction, when the holes are worked while the vibration of several ten hertz is given to the punch, and the pressing members are made to abut against the board so that the board is pressed thereby in a single-sided punch pressing device, the board is gradually sheared as the punch is being inserted into the board in a first hole-work operation. Thus, a hole is bored and the punch is inserted into the hole. At this time, the inner part of the hole in the board undergoes such force through the pressing members as to abut against the side surface of the punch. As a result, the inner surface of the hole is pressed to the punch member. Since the vibration of several ten hertz is exerted on the punch, the inner surface of the hole in the board more strongly abuts against the punch by virtue of the pressing force of the pressing members. Consequently, a finely sheared surface is more smoothed.

Although, when the punch is then drawn from the hole, there exists no resistance by the punch in the hole bored in the board, the board is pressed by the pressing members, and therefore, the longitudinal sectional face of the hole in the board is formed a swelling part. When the punch is re-inserted into this hole, while applying the non-vibration or the vibration of several ten hertz to the punch, then, this swelling part is cut and, at the same time, the inner surface of the hole is smoothed again by the punch.

When the punch is again pulled out of the hole, the longitudinal sectional face of the hole in the board pressed by the pressing members is again formed a swelling part. However, the amount of the swelling part is decreased. Furthermore, the sheared surface of the hole is softened because of a frictional heat due to the pressing force of the pressing members and the vibration of the punch and the internal stress of the swelling part is also reduced. Therefore, when the pressing members are detached from the board to thereby release the pressing force substantially simultaneously with drawing of the punch from the hole, the swelling part substantially disappears owing to the elastic return of the board and a greatly smooth hole with a high-degree of form accuracy can be obtained. More particularly, since the pressing members are designed to press the compound material while the penetrations and drawings of the punch into/from the holes are repeated, the board is not moved and positional accuracy in repeating the insertion and drawing of the punch is also satisfactory.

By this vibration finishing method in a single sided punch-pressing device of the present invention, a smothered hole having substantially no swelling part and having fine surface roughness without deformation in a composite material board such as printed circuit bord with significantly improved accuracy and reduced working cost can be bored.

The pressing members are designed to press a base material toward the center of the hole provided in the board based on the pressing force, and to be controlled by such a force as to prevent the sectional face of the hole from being formed in a swelling or convex surface when the pressing force is released. Additionally, the form accuracy of the hole can be improved as the punching tool is repeatedly re-inserted into and drawn from the hole several times, so that the form accuracy of the hole can be improved. If the inner surface of the hole is finished with the mutual sliding between the punching tool and the inner wall of the hole, while a minute-vibration of several ten hertz is exerted on the punching tool even after the punching tool is pulled out of the hole, and then, the inner surface of the hole will be worn due to frictional heat or the like and the surface roughness thereof will be improved.

The pressing plate is provided a dice hole to which the punching tool is slidably fitted with a small gap provided therebetween so that they press the periphery of the hole in the board and also serve as the guide of the punch. If a fluid cylinder is employed for controlling the pressing force of the pressing members, a complicated control, for example, a control for changing the pressing force of the pressing members during the working of a hole can be made. Therefore, the most preferable hole punching and working conditions can be simply set.

The pressing members of the present invention are similar to a discharge plate for removing a board from the inner part of a metal mold which has been generally used in prior art pressing machines. However, the conventional discharge plate has not been employed to restrain the movement of the board, nor has it taken into consideration the elastic deformation of the board. Therefore, the conventional discharge plate does not play a role of the present invention. Further, the above-mentioned Japanese Unexamined Patent Publication No. sho. 62-241700 discloses a clamp for clamping the board. In this Publication, the structure and operation of the clamp are not specifically disclosed, however, it can be at least said that the clamp is not provided with a function for coping with the elastic deformation of the board. Furthermore, Japanese Unexamined Patent Publication No. sho. 57-102310 discloses a vibration finishing method provided with upper and lower punches. In this method, a board is sandwiched between upper and lower dice, however, they have been provided in order to prevent a material from moving relative to the movement of the upper and lower punches and not provided to conduct the same operation as that of the present invention.

Further, the present invention can be put into practice only by providing a vibrating member for applying a vibration to the punch and by providing a pressing members for pressing the compound material in the single-sided punch pressing device. Therefore, a metal mold which has been conventionally used can be successively used, which preferably contributes to the provision of an inexpensive vibration finishing method and apparatus for working holes at low cost.

Furthermore, in accordance with the present invention, since the pressing force imposed upon the hoard can be simply controlled by the use of an adjusting member or a fluid cylinder capable of adjusting the pressing force to the board, the most desirable punching conditions can be readily and simply set.

BRIEF DESCRIPTION OF THE DRAWINGS

Other features and advantages of the present invention will be apparent from the following description taken in connection with the accompanying drawings, in which.

DETAILED DESCRIPTION OF THE PREFERRED EMBODIMENT

Figure 1:
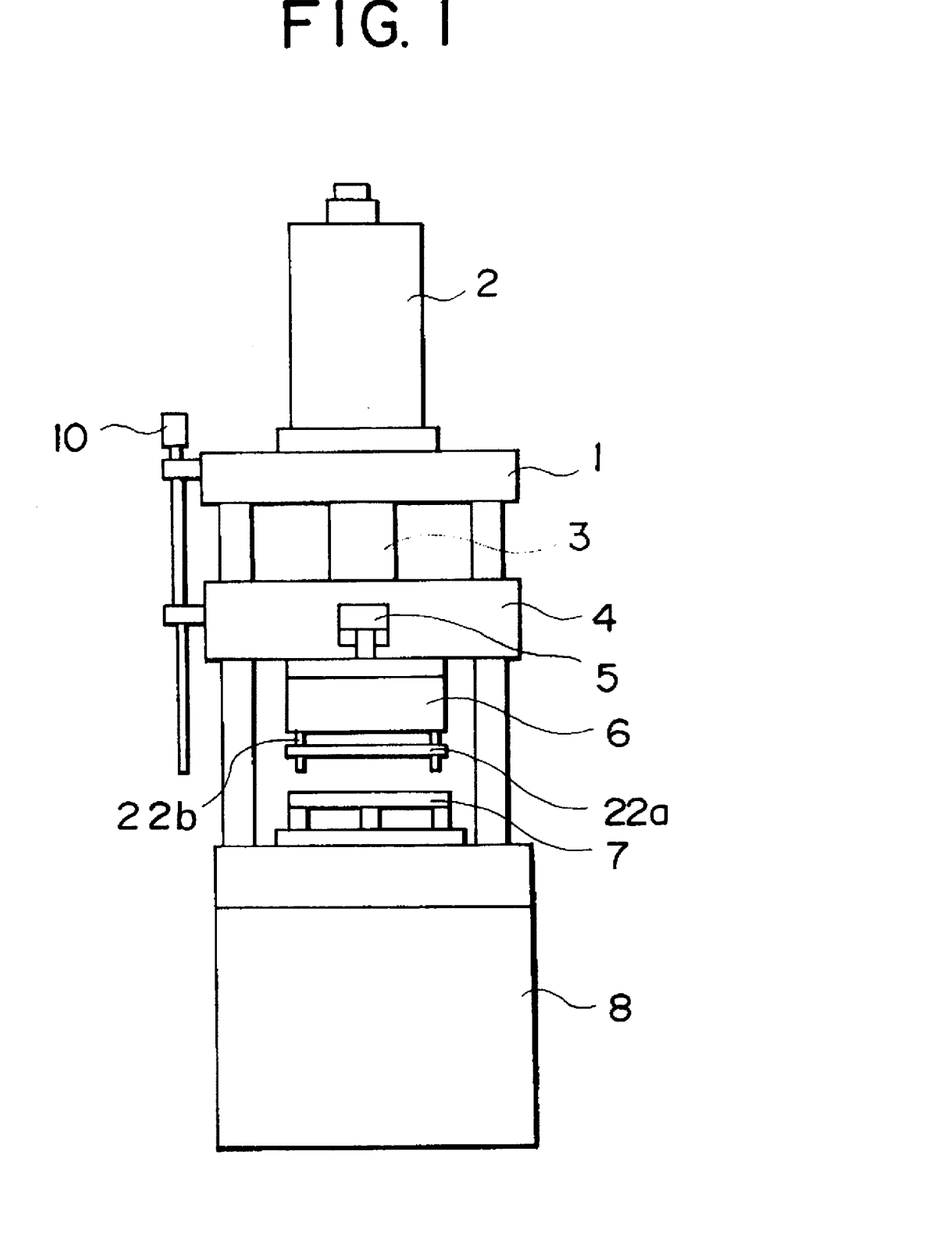
FIG. 1 is a schematic of a vibration finishing apparatus according to a first embodiment of present invention.
Figure 2:
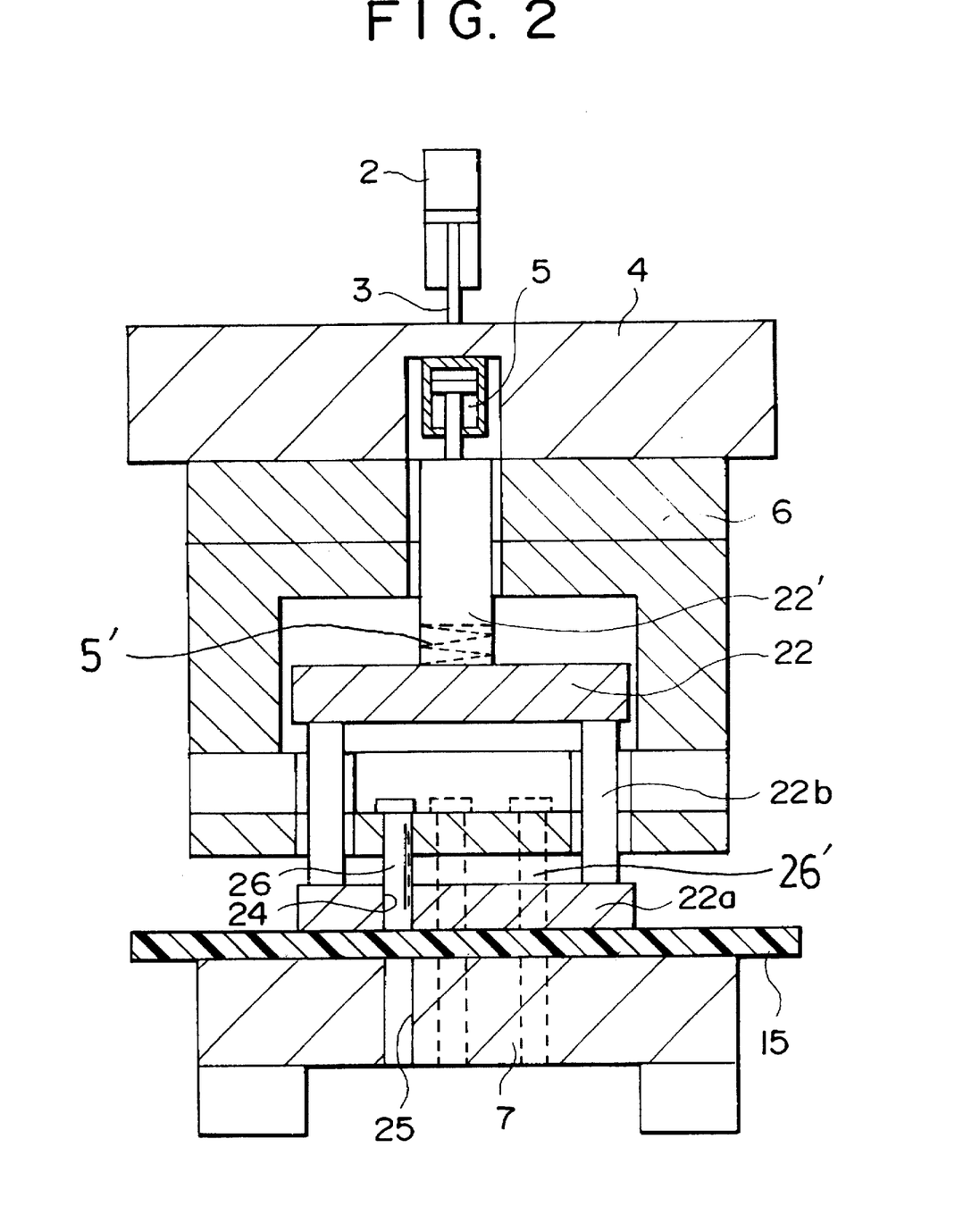
FIG. 2 is an illustration of parts in the vicinity of metal molds shown in FIG. 1.

An embodiment of the present invention will now be described with reference to the accompanying drawings. FIG.. 1 illustrates a main body of a vibration finishing and working apparatus. As illustrated in FIG. 1, an punching cylinder 2 which is reciprocable and/or viblatile is attached to a frame 1 of the main body. To the lower end of an punching cylinder rod 3, is connected a metal mold attaching plate 4. A pressing cylinder 5 is accommodated in the metal mold attaching plate 4. As can be seen in FIG. 2, a rod of the pressing cylinder 5 is connected to a pressing members 22 integrally formed with a pressing plate 22a. To the metal mold attaching plate 4, an upper metal mold 6 is attached. A lower metal mold 7 is attached to a lower frame 8 of the main body. A pressure oil is supplied to the punching cylinder 2 through a hydraulic valve 9 from a hydraulic power source either not shown. To the upper frame 1 of the main body, a position sensor 10 for detecting the position of the metal mold connecting plate 4 is attached.

FIG. 2 is an explanatory view of parts in the metal molds shorn in FIG. 1. Referring to FIG. 2, a board 15 to be worked is inserted between the pressing plate 22a integrally formed with the pressing members 22 which are capable of pressing the board by means of the pressing cylinder 5 and the lower metal mold 7. In the pressing plate 22a and the lower metal mold 7, die holes 24 and 25 are respectively bored which respectively pass through in the longitudinal direction. A punching tool 26 is attached to the upper metal mold 6 which is mounted on the metal mold attaching plate 4. The punching tool 26 can be fitted and slid into the die holes 24 and 25 in the pressing plate 22a and the lower metal mold with a small gap left therebetween. Further, the punching tool 26 can be inserted into the board 15 along the die holes 24 and 25 by means of the punching cylinder 2 together with the metal mold attaching plate 4 to which the upper metal mold 6 is attached.

Figure 3:
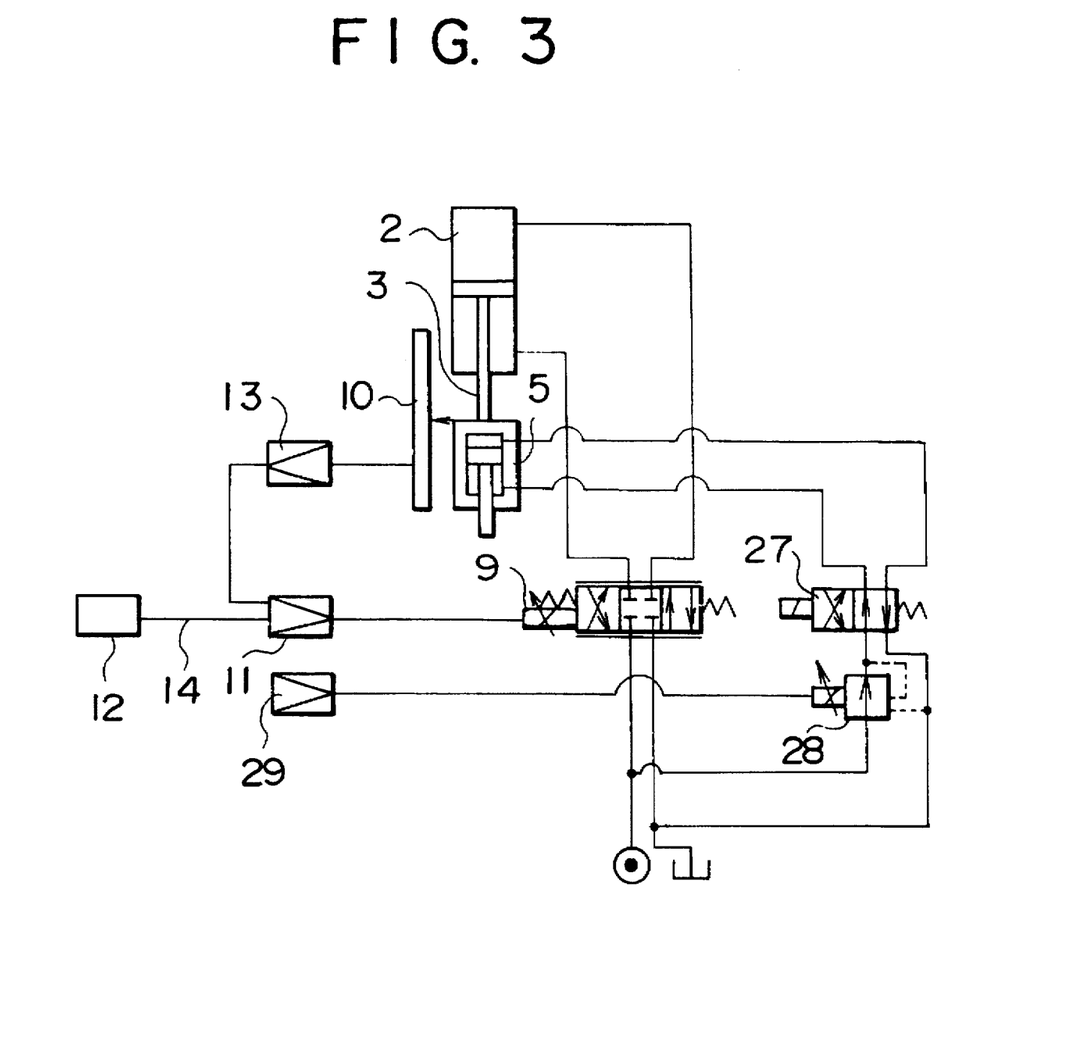
FIG. 3 is a schematic block diagram of a hydraulic control circuit of the apparatus of FIG. 1.

FIG. 3 is a schematic block diagram of a hydraulic control circuit of the vibration finishing apparatus of 1. A control valve 9 is controlled by the control signal of a control valve amplifier 11. To the control valve amplifier 11 is connected a command signal generator 12 for outputting a basic command signal 14 to command sine waves of several hertz to several ten hertz and a desired small amount feed to the punching tool 26 via the punching cylinder 2. A position signal from the position sensor 10 for detecting the amount of movement of the punching cylinder rod 3 is inputted to a position sensor amplifier 13. Then, at the same time, the position signal is also outputted as a feedback signal to the control valve amplifier 11. Thus, the control valve amplifier 11 carries out a voltage/current conversion so that an error signal between the command signal and the feedback signal becomes 0 and outputs a current as a control signal to the control valve 9. Accordingly, the cylinder rod 3 and the metal mold attaching plate 4 are so always controlled as to move following the command signal from the command signal generator 12. Further, the pressing cylinder 5 attached to the lower end of the cylinder rod 3 is so controlled by a directional control valve 27 as to press the board 15 on the lower die 7, and lift up from it. A pressing pressure is controlled by an electromagnetic proportional pressure control valve 28 based on a control current from an electromagnetic proportional pressure control amplifier 29.

Figure 4:
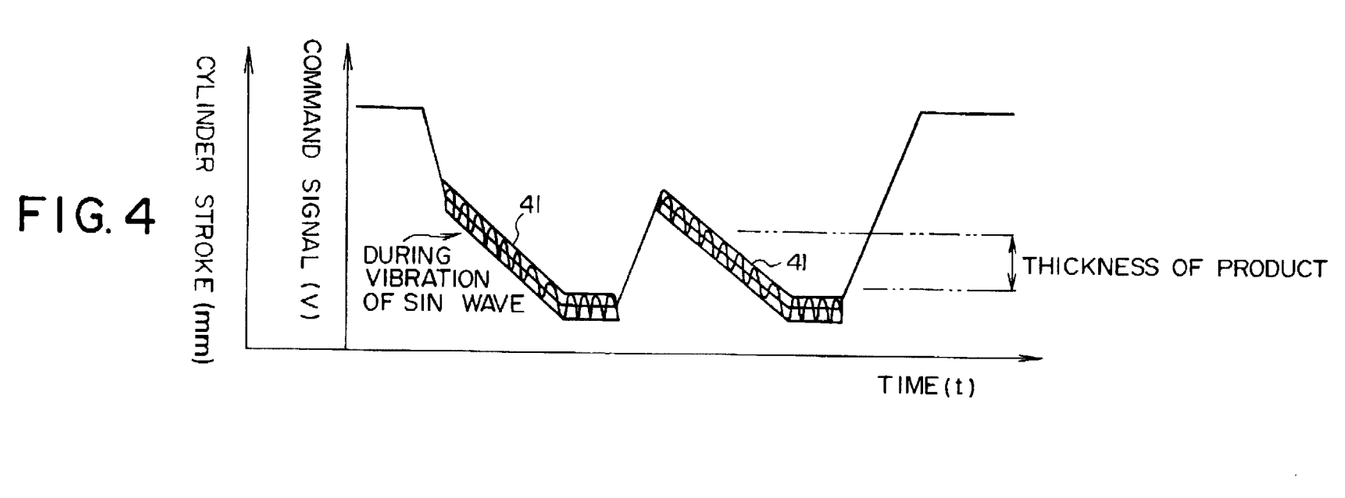
FIG. 4 is an output waveform diagram of basic command signals which are applied to the punching tool of the apparatus of FIG. 2.

An operation of the vibration finishing apparatus according to the invention will be described in the following. While a board 15 to be worked is inserted between the pressing plate 22a and the lower metal mold 7 is pressed by the pressing members 22 by means of the pressing cylinder 5, the punching tool 26 is applied the basic command signals shown in FIG. 4 with an amplitude of several ten μm to several mm at a frequency of several hertz to several ten hertz and the punching tool 26 is lowered. Thus, while the upper metal mold 6 integrally formed with the metal mold attaching plate 4 and the punching tool 26 are guided by the die hole 24 of the pressing plate 22a, they are inserted into the board 15 to thereby punch out the board 15. The punching tool is further lowered until the punching tool reaches the die hole 25 of the lower metal mold. In this way, punching operations of an amplitude of several ten μm to several mm at a frequency of several hertz to several ten hertz are repeatedly performed by the comanded vibration. Once the punching tool is lowered to the lower metal mold, the punching tool 26 is lifted up without applying vibration until the punching tool is completely drawn from the board 15 while a board 15 is pressed. At this time, what is called, a shear drop or swelling, specifically stated, a convexed swell formed in a part of the inner surface of the hole in the board which is caused by virtue of the restoring action of the board 15, is generated. In order to remove the shear drop or swelling, the punching tool 26 is re-inserted into the hole in the board 15, while the vibration is again applied to the punching tool. In such a manner, the shear drop or swelled part of the inner surface of the hole of the board 15 is removed. Then, the punching cylinder is again lifted up to finish the one cycle punching operation.

At this time, since the pressing cylinder 5 presses the board 15 through the pressing plate 22a during the above punching operation. The bord 15 generates an internal stress therein owing to the pressing force thereof, resulting in a lateral pressure exerted upon the punching tool 26 to be penetrated into the board 15. Additionally, after the punching tool is pulled out of the hole, the pressing force of these pressing members causes the inner surface of the hole in the board to forcibly produce swelling part. Since the pressing cylinder 5 has a main body side attached to the metal mold attaching plate 4, the cylinder 5 moves together with the movement of the punching cylinder 2 and recieves an external fore caused by the movement of the cylinder 2. However, since the thickness of the board 15 is of small, the stroke of the movement of the punching cylinder is also small, the pressure can be controlled to a constant value by the pressure control valve 28, enabling to controll the board to press at a constant pressure. Further, the pressing cylinder 5 is lifted up or lowered together with the metal mold attaching plate 4 by the punching cylinder 2, even when the pressing cylinder 5 moves in a small stroke, an entire stroke can be increased. Therefore, the board 15 can be readily attached to or detached from the dies.

Figure 5:
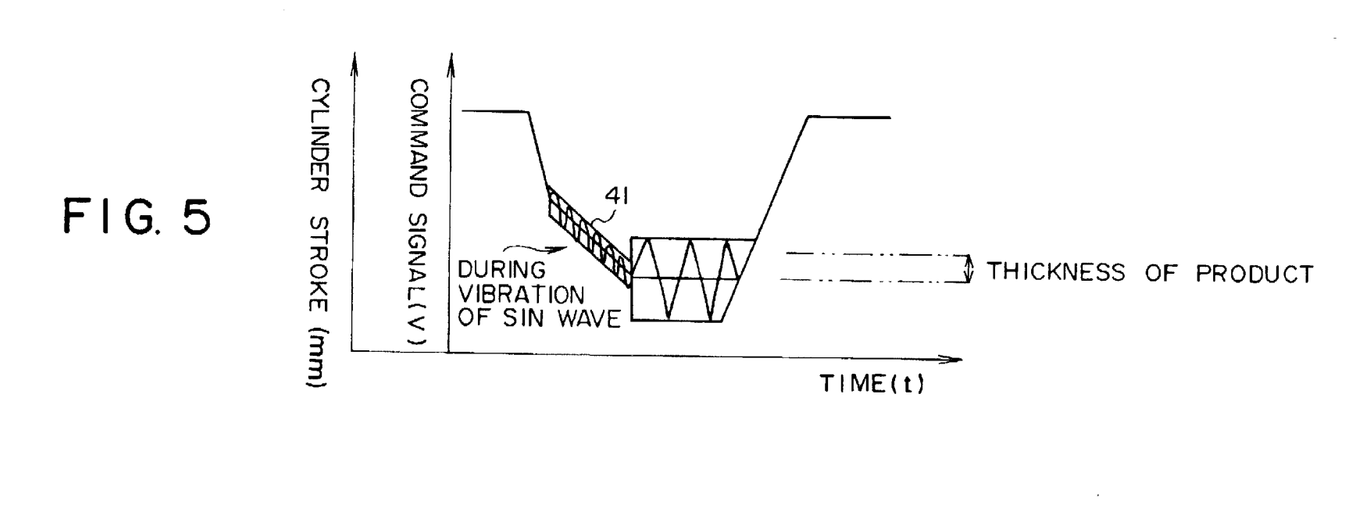
FIG. 5 is another output waveform diagram of basic command signals similarly applied to the punching tool of the apparatus of FIG. 2.

More specifically, even after the board is punched out, the punching tool 26 may be moved upward and downward in reciprocation, so that the inner surface of the hole can be finely finished. Punching residue is discharged from the die hole 25. Although, in the above-stated embodiment shown in FIG. 4, vibrating and punching operations are carried out two times, however, it is to be understood that they may be more repeated depending on the shape of a hole or the material of a board. As illustrated in FIG. 5, after one cycle vibrating and punching operation punching operations, a reciprocating movement of the punching cylinder 2 may be repeated without applying a vibration while the board 15 is pressed by the pressing members 22. This method is more effective for the purpose of reducing the swelling parts on the inner surface of the hole, rather than for the purpose of finishing the inner surface of the hole.

Alternately, in place of the pressing cylinder 5, as shown in dotted line in FIG. 2, an elastic member 5' such as urethane, springs, etc., and an adjusting member capable of adjusting the resilient force of the elastic member not shorn are employed as an integral part of the longitudinal support member 22' of the pressing member 22, so that the pressing plate 22a is elastically supported by the metal mold attaching plate 4. In this case, a pressing force is changed depending upon the movement of the punching cylinder 2. However, if the thickness of the board 15 is small, then, the pressing force rill not be greatly changed. Thus, the elastic member 5' means which is simpler than the above mentioned pressing cylinder 5 may be employed.

Although, in the above stated embodiment, the description is made in connection with one punching tool 26, however, as shorn in dotted line in FIG. 2, the number of punching tools 26' may be utilized. Therefore, it rill be appreciated that various modifications and changes may be made without departing from the purport of the invention.

Experimental Examples

Figure 6:
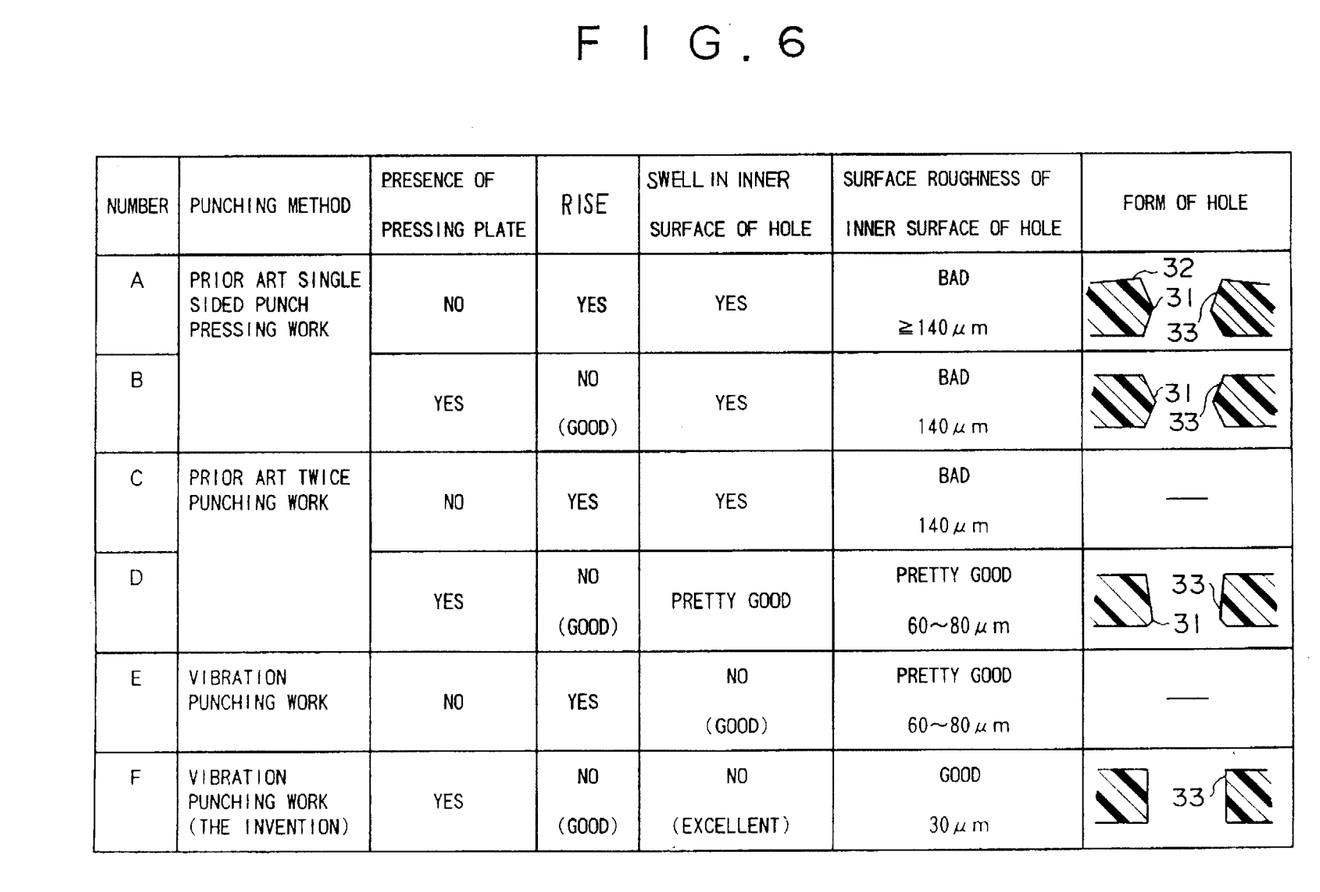
FIG. 6 is a diagram showing experiment results of the present invention compared with those of prior art punching methods.

FIG. 6 shows a Table illustrating various experimental results when a hole is punched and worked by the above mentioned punch press shown in FIG. 1 under various kinds of conditions, compareing with a prior art single one time punching technique by a single-sided punch press (A, B), a prior art twice punching technique by a single-sided punch press (C, D), an experimental vibration finishing method (B) which do not use the pressing cylinder 5 to presse the board 15 by the pressing plate 22a during the punching operation, and the vibration finishing method (F) of this invention. In each punching methods, punching experiments were conducted in terms of the presence or absence of a pressing plate. In the case of the present invention, the pressing plate was added to the vibration punching method as illustrated in F. In FIG. 6, an inner surface swelling of a hole was measured in the surface of a part represented by a hole configuration 31 in FIG. 6, a rise was determined in that of a part indicated by 32 and the surface roughness Ra of a hole was measured in that of a part represented by 33.

As can be seen in FIG. 6, in accordance with the prior art pressing method, the swell parts or the projecting parts were formed and the surface roughness Ra was as bad as not less than 60 μm. On the contrary, in accordance with the present invention, as shown in F, there were not formed swell part or the projecting part and the inner surface of the hole was significantly better than those of other examples, and further, surface roughness Ra was as good as 30 μm. Particularly, as can be seen in the example E, when the pressing plate of the present invention as not provided even in the vibration punching work method, the swell part was formed. The obtained experiment results of the example E were both inferior to those of the present invention example F from the view points of the formation of swell in the inner surface of the hole and the surface roughness. Therefore, the object of the present invention could not be attained in accordance with the method adopted by the example E which assures the excellence of the present invention.

With reference to the above prior art punching and working methods, a pin used as a punching tool was generally buckled in case where through-holes are worked in the printed board of the thickness of over about 1.6 mm. Therefore, the diameter of the pin was limited to over about 0.8 mm in the prior art method. In addition, since the surfaces between the holes were liable to be cracked, pitches of the through-holes were also limited to 2 mm, even when the holes in the board were heated. However, in accordance with the present invention, when the holes in the board were not heated under the operating conditions shown in FIG. 4, the through-holes at a pitch of 1.5 mm with a pin whose diameter is 0.5 mm could be formed and worked without a buckling and cracking. Furthermore, in the present invention, the through-holes could be worked with the punching force of approximately 20 tonf, which was ⅔ times as strong as the conventional punching force under an ordinary temperature. Therefore, only punching force ⅔ time as strong as that of the conventional press may be necessary. Moreover, since a large force is not instantaneously applied to the board, the generation of destruction, fatigue and inconvenience can be greatly reduced in the vibration finishing apparatus and components thereof, which results a further additional effects of the vibration finishing method and apparatue of the present invention.

What is claimed is:

1. A method of vibration finishing a printed board comprised of a compound material, comprising the steps of:
   providing a punch pressing device having a movable pressing member, a movable punching tool, and a die having a die hole bored therein located beneath the pressing member and the punching tool;
   mounting the printed board on the die;
   pressing the printed board with the pressing member to cause an elastic deformation of the printed board;
   punching a hole into the printed board using the punching tool during said pressing step, so that the punching tool penetrates the printed board, and is insertable into the die hole of the die;
   applying a minute vibration of several tens of hertz to the punching tool during said punching step;
   drawing the punching tool from the hole in the printed board subsequent to said punching step while continuing to press the printed board with the pressing member; and
   re-inserting the punching tool into the hole in the printed board while continuing to press the printed board with the pressing member, and in the absence of the application of vibrations to the punching tool.

2. The method recited in claim 1, wherein said drawing step and said re-inserting step are repeated a plurality of times.

3. The method recited in claim 1, further comprising the step of applying, subsequent to said punching step, the minute vibration of several tens of hertz to the punching tool while the punching tool is located within the hole to finish an inner surface of the hole using a relative sliding motion of the punching tool and the inner surface.

4. The method recited in claim 2, further comprising the step of applying, subsequent to said punching step, the minute vibration of several tens of hertz to the punching tool while the punching tool is located within the hole to finish an inner surface of the hole using a relative sliding motion of the punching tool and the inner surface.

5. A method of vibration finishing a printed board comprised of a compound material, comprising the steps of:
   providing a punch pressing device having a movable pressing member, a movable punching tool, and a die having a die hole bored therein located beneath the pressing member and punching tool;
   mounting the printed board on the die;
   pressing the printed board with the pressing member to cause an elastic deformation of the printed board;
   punching a hole into the printed board using the punching tool during said pressing step, so that the punching tool penetrates the printed board, and is insertable into the die hole of the die;
   applying a minute vibration of several tens of hertz to the punching tool during said punching step;
   drawing the punching tool from the hole in the printed board subsequent to said punching step while continuing to press the printed board with the pressing member; and
   re-inserting the punching tool into the hole in the printed board while continuing to press the printed board with the pressing member, and applying the minute vibration of several tens of hertz to the punching tool.

* * * * *